United States Patent [19]

Yoshioka et al.

[11] Patent Number: 4,873,162

[45] Date of Patent: Oct. 10, 1989

[54] X-RAY MASK AND A MANUFACTURE METHOD THEREFOR

[75] Inventors: Nobuyuki Yoshioka; Nobuo Fujiwara; Yaichirou Watakabe, all of Itami, Japan

[73] Assignee: Mitsubishi Denki Kabushiki Kaisha, Japan

[21] Appl. No.: 85,210

[22] Filed: Aug. 14, 1987

[30] Foreign Application Priority Data

Aug. 20, 1986 [JP] Japan ............................. 61-195991
Mar. 20, 1987 [JP] Japan ............................. 62-66254

[51] Int. Cl.⁴ ............................................. G03F 1/00
[52] U.S. Cl. ................................... 430/5; 430/296; 430/323; 378/35
[58] Field of Search .................. 430/5, 296, 323, 942, 430/966; 378/35

[56] References Cited

U.S. PATENT DOCUMENTS

| 4,037,111 | 7/1977 | Coquin et al. ............. 430/5 X |
| 4,719,161 | 1/1988 | Kimura et al. ............. 430/5 |
| 4,722,878 | 2/1988 | Watakabe et al. .......... 430/5 |

FOREIGN PATENT DOCUMENTS 166346 10/1983 Japan .................................... 430/5

OTHER PUBLICATIONS

Karnezos et al., "Tungsten: An Alternative to Gold for X-Ray Masks", J. Vac. Sci. Technol. B 5(1), Jan./Feb. 1987, pp. 283–287.

Maldonado et al., "Thin Film Structure to Reduce Radiation Damage in X-Ray Lithography", J. Vac. Sci. Technol. B 5(1), Jan./Feb. 1987, pp. 248–252.

Primary Examiner—José G. Dees
Attorney, Agent, or Firm—Leydig, Voit & Mayer

[57] ABSTRACT

An x-ray mask for x-ray lithography has an x-ray absorber pattern which is formed from a Ti-W alloy with a Ti content of 0.5–10 weight %. A method for the manufacture of the x-ray mask comprises sequentially forming a first film, a Ti-W alloy film with a Ti content of approximately 0.5–10 weight %, and a third film on a mask substrate and coating the third film with an electron beam-sensitive resist, exposing the resist to an electron beam and then developing the exposed resist to form a resist pattern, using the resist pattern as a mask and selectively etching the third film to form a pattern, and using the pattern as a mask and selectively etching the Ti-W alloy film with a reactive gas to form an absorber pattern. The Ti-W alloy film is preferably formed by sputtering in an atmosphere of argon and nitrogen gas with a nitrogen content of approximately 30–50%, whereby nitrogen is included in the Ti-W alloy film.

9 Claims, 6 Drawing Sheets

X-RAY MASK AND A MANUFACTURE METHOD THEREFOR

BACKGROUND OF THE INVENTION

This invention relates to an x-ray mask for use in the manufacture of semiconductor devices by x-ray lithography. More particularly, it relates to an x-ray mask which employs a Ti-W alloy as an x-ray absorber pattern.

Since the advent of x-ray lithography, the material used for absorber patterns of x-ray masks has primarily been gold. Gold has a high absorption coefficient with respect to the soft x-rays (such as those corresponding to the PdL$\alpha$, MoL$\alpha$, and SiK$\alpha$ lines) which are used in x-ray lithography. Furthermore, as gold is soft compared to other metals, when a gold film is formed on a mask substrate, the stresses which are imparted to the substrate, which are the cause of distortions in the absorber pattern, are low.

However, gold is chemically stable, and while it has good resistance to chemicals, it is not possible to pattern a gold film using reactive ion etching, which is now much employed for the processing of semiconductor devices. Instead, it is necessary to pattern a gold film by ion sputter etching or by the lift-off method using electroplating. Ion sputter etching is a method in which gold is sputtered by an argon plasma and etching is performed. In this method, the sputtered gold is redeposited on the mask substrate which is being processed, and therefore an absorber pattern with vertical edges can not be obtained. On the other hand, the lift-off method using electroplating involves a step in which a resist pattern for lift-off is formed and a step in which electroplating is performed. It is therefore complicated, and as plating is a wet process, the resulting pattern has many defects.

In recent years, tungsten has come to be used as an alternative to gold as a material for x-ray absorber patterns. Tungsten has approximately the same x-ray absorption coefficient as gold, and it has the advantage that a pattern with vertical edges and a width on the order of 1 micron can be achieved by reactive ion etching with a conventional reactive gas such as $CF_4$.

However, a tungsten absorber pattern has the drawback that it has poor adhesion to inorganic compounds such as SiN, $SiO_2$, and BN which are commonly used as the substrates for x-ray masks, and the absorber pattern may peel off the mask substrate when the mask is washed or otherwise processed subsequent to the formation of the absorber pattern.

SUMMARY OF THE INVENTION

It is therefore an object of the present invention to provide an x-ray mask having an x-ray absorber pattern which can be patterned by reactive ion etching.

It is another object of the present invention to provide an x-ray mask having an x-ray absorber pattern which has good adhesion to conventional mask substrates.

It is still another object of the present invention to provide an x-ray mask having an x-ray absorber pattern with a low internal stress.

It is yet another object of the present invention to provide a method for the manufacture of such an x-ray mask.

The present inventors discovered that a Ti-W alloy with a Ti content of approximately 0.5-10 weight % has a high absorption coefficient with respect to the soft x-rays used in x-ray lithography the absorption coefficient is on the order of that of pure tungsten, but at the same time the alloy has greatly superior adhesion with respect to the inorganic compounds which constitute the substrates of x-ray masks. Furthermore, it can be patterned using reactive ion etching in the same manner as a tungsten absorber pattern. Accordingly, a Ti-W alloy can be used to form an absorber pattern having good peeling resistance.

An x-ray mask in accordance with the present invention comprises a mask substrate and an x-ray absorber pattern which is formed atop the substrate, the material which is used to form the x-ray absorber pattern being a Ti-W alloy with a Ti content of approximately 0.5-10 weight %.

A method for the manufacture of an x-ray mask in accordance with the present invention comprises sequentially forming a lower film which serves as an etching stopper, a Ti-W alloy film with a Ti content of approximately 0.5-0 weight %, and a third film which serves as an etching mask on a mask substrate and coating the third film with an electron beam-sensitive resist, exposing the electron beam-sensitive resist to an electron beam in a prescribed pattern and developing the exposed resist to form a resist pattern, selectively etching the third. film while using the resist pattern as a mask to form an upper pattern, and selectively etching the Ti-W alloy film with a reactive gas while using the upper pattern as a mask to form a prescribed pattern in the Ti-W alloy film.

The first and third and lower films which sandwich the Ti-W alloy film are made of a material which is difficult to etch with the reactive gas employed to etch the Ti-W alloy film so that they can serve as an etching mask and an etching stopper, respectively. In a preferred embodiment, the Ti-W alloy film, is etched using a ($CF_4+O_2$) gas plasma, and the first and third films are made of $SiO_2$.

Suitable methods for forming the Ti-W alloy film include DC sputtering and rf sputtering. In order to reliably obtain a sputtered Ti-W alloy film with low internal stress and high density, the sputtering is preferably carried out in an atmosphere of argon mixed with nitrogen, whereby nitrogen is included in the Ti-W alloy film. Particularly good results are obtained when the nitrogen content of the atmosphere is 30–50%.

BRIEF DESCRIPTION OF THE DRAWINGS

In the drawings, the same reference numerals indicate the same or corresponding parts.

DESCRIPTION OF THE PREFERRED EMBODIMENTS

Figure 1:
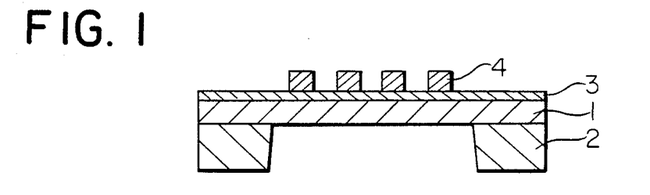
FIG. 1 is a vertical cross-sectional view of an embodiment of an x-ray mask with a Ti-W alloy absorber pattern in accordance with the present invention.

Hereinbelow, an embodiment of an x-ray mask in accordance with the present invention and a method for the manufacture thereof will be described while referring to the accompanying drawings. As shown in FIG. 1, which is a vertical crosssectional view of this embodiment, a mask substrate 1 has a silicon ring 2 formed on the periphery of its lower surface. The mask substrate 1 is made of a conventionally-used inorganic compound which is permeable to x-rays such as BN, SiN, or $SiO_2$. An $SiO_2$ film 3 which serves as an etching stopper is formed atop the substrate 1, and an x-ray absorber pattern 4 is formed atop the $SiO_2$ film 3. The absorber pattern 4 is made of a Ti-W alloy having a Ti content of approximately 0.5-10 weight % and is approximately 1 micron thick.

Figure 3:
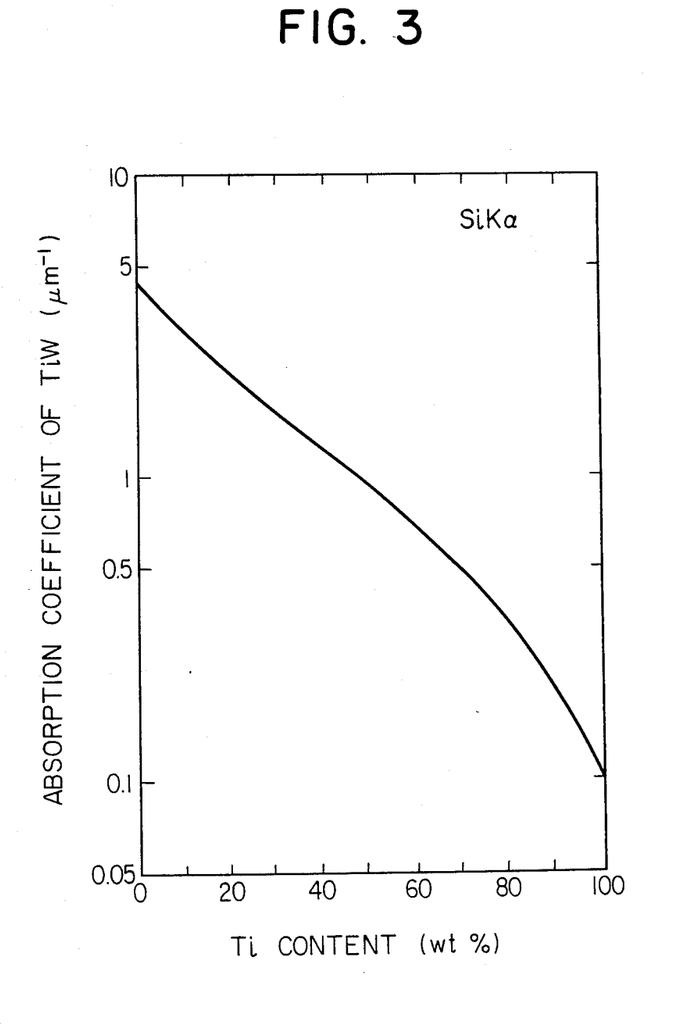
FIG. 3 is a graph showing the relationship between the x-ray absorption coefficient and the Ti content of a Ti-W alloy.

A Ti-W alloy having a Ti content of approximately 0.5-10 weight % is suitable from the standpoint of its x-ray absorption coefficient. FIG. 3 is a graph of the relationship between the absorption coefficient of a Ti-W alloy with respect to x-rays having a wavelength corresponding to the SiK$\alpha$ line and the Ti content of the alloy. When the Ti content is approximately 0.5-10 weight %, the absorption coefficient is roughly the same as that of a conventional absorber pattern made of tungsten. Furthermore, a Ti-W alloy absorber pattern having a Ti content in the above range has approximately the same mask contrast as an absorber pattern made of tungsten. For example, with a pattern thickness of 1 micron, the mask contrast is 30 or above.

The present inventors also investigated the relationship between the Ti content of a Ti-W alloy absorber pattern and its adhesion to an SiN mask substrate. A plurality of lots of x-ray masks were prepared, each lot consisting of one hundred masks and each mask comprising an SiN mask substrate on which a Ti-W alloy absorber pattern was formed as shown in FIG. 1. The Ti content of the Ti-W alloy was varied among the lots. The masks were then cleaned for approximately 5 minutes by ultrasonic cleaning with water, after which the number of Ti-W absorber patterns of each lot which had peeled was counted.

Figure 4:
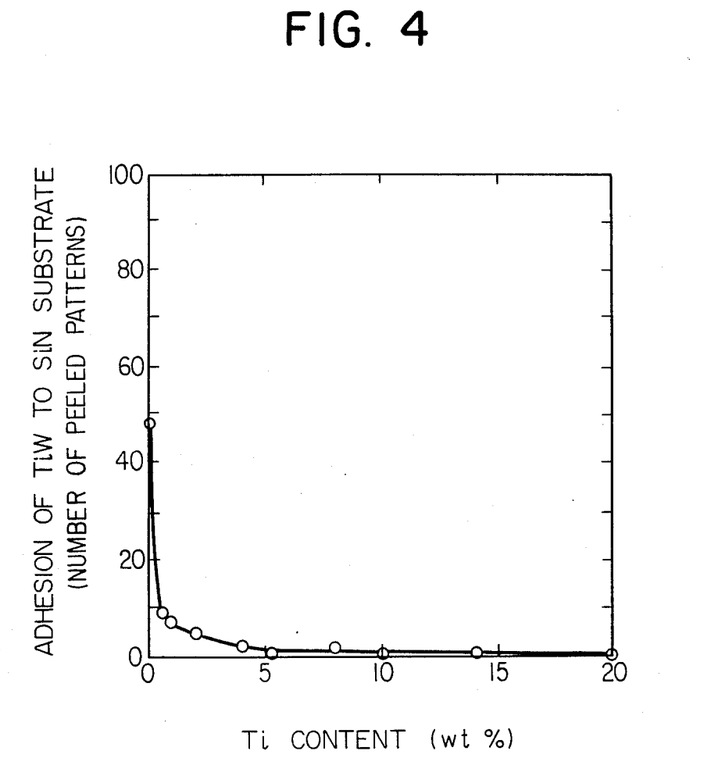
FIG. 4 is a graph showing the relationship between the number of peeling defects of Ti-W alloy absorber patterns and the Ti content of the alloy.

FIG. 4 shows the results of the peeling tests. For masks having absorber patterns made of only tungsten, nearly half the masks in the lot had peeling of the absorber patterns. In contrast, the adhesion of Ti-W alloy absorber patterns containing even a small amount of Ti was greatly superior to that of absorber patterns made of tungsten alone. For a Ti-W alloy absorber pattern with a Ti content of only 0.5 weight % (the lowest value tested), only 10 masks in the lot were peeled. As the Ti content further increased, the adhesion of the Ti-W alloy absorber patterns was still further improved, and the number of peeled patterns fell to substantially zero.

Thus, from the standpoints of coefficient of absorption, mask contrast, and adhesion, a Ti content of approximately 0.5-10 weight % is suitable for a Ti-W alloy absorber pattern.

Next, a method of manufacturing the x-ray mask of FIG. 1 will be described while referring to FIGS. 2a-2e, which illustrate the various steps in this method. First, a film 3 which serves as an etching stopper, a Ti-W alloy film, 4a with a Ti content of approximately 0.5-10 weight %, and a third upper film 5a which serves as an etching mask during the reactive ion etching of the Ti-W alloy, film 4a are, formed in succession atop a mask substrate 1 the film are formed by a method such as DC sputtering or rf sputtering, although other methods of forming films can be used instead. The substrate 1, which is made of an inorganic material which is permeable to x-rays such as BN, SiN, or $SiO_2$, has a silicon ring 2 formed on the periphery of its bottom surface. An electron beam-sensitive resist 6a is then formed atop the third film 5a by spin coating to obtain the structure shown in FIG. 2a. The films 3 and 5a can be made of $SiO_2$. Examples of film thicknesses are approximately 1000 angstroms for the film 3, approximately 1 micron for the Ti-W alloy film 4a, and approximately 2000-3000 angstroms for the-upper film 5a.

Figure 2A:
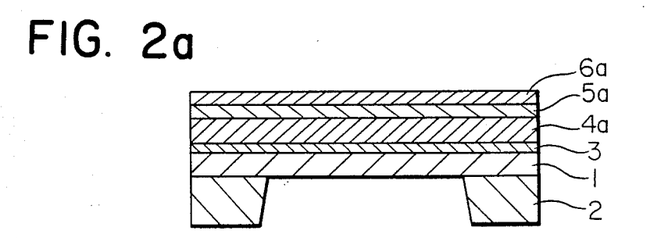
FIGS. 2a through 2e are vertical cross-sectional views illustrating the steps in the manufacture of the x-ray mask of FIG. 1 by the method of the present invention.
Figure 2B:
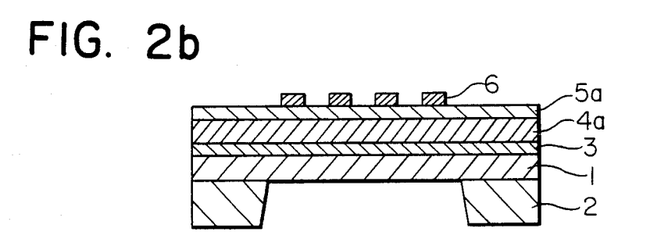
Figure 2C:
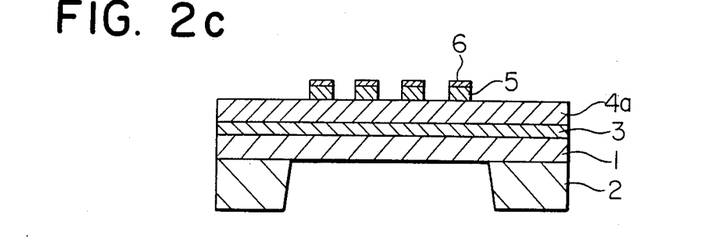

Next, the electron beam sensitive resist 6a is exposed to an electron beam in a prescribed pattern, after which developing is carried out to form a resist pattern 6 as shown in FIG. 2b. Using the resist pattern 6 as a mask, the upper film 5a is then selectively etched away by reactive ion etching using a reactive gas mixture such as ($CF+H_2$), thereby forming an upper pattern 5, as shown in FIG. 2c.

Figure 2D:
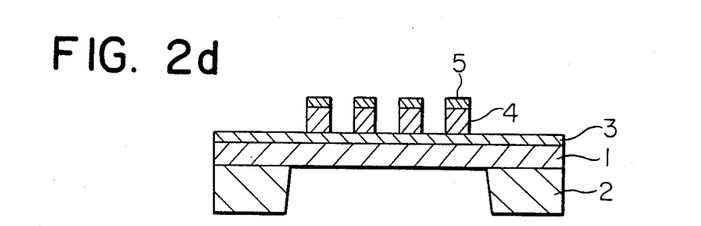
Figure 2E:
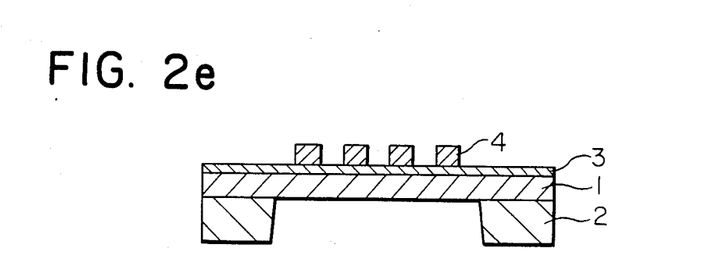

The upper pattern 5 is then used as a mask, and the Ti-W alloy film 4a is selectively etched away by reactive ion etching using a reactive gas mixture such as ($CF_4+O_2$) (see FIG. 2d). The upper pattern 5 is then removed by suitable means, leaving a Ti-W alloy absorber pattern 4, as shown in FIG. 2e. As reactive ion etching is employed to etch the Ti-W alloy film 4a, an absorber pattern 4 with vertical edges and a pattern width on the order of 1 micron can be easily obtained.

The films 5a and 3 should be made of a material which is difficult to etch with the reactive gas which is used to etch the Ti-W alloy film 4a so that the upper pattern 5 can serve as an etching mask and the lower film 3 can serve as an etching stopper. When a ($CF_4+O_2$) gas mixture is used to etch the Ti-W alloy film 4a, $SiO_2$ is a suitable material for the upper and lower films since the etching rate thereof is approximately 1/10 of the etching rate of the Ti-W alloy film 4a. Furthermore, as $SiO_2$ is optically transparent to x-rays, if the lower film 3 is made of $SiO_2$, it will not need to be removed from the substrate 1 after formation of the absorber pattern 4.

Figure 5:
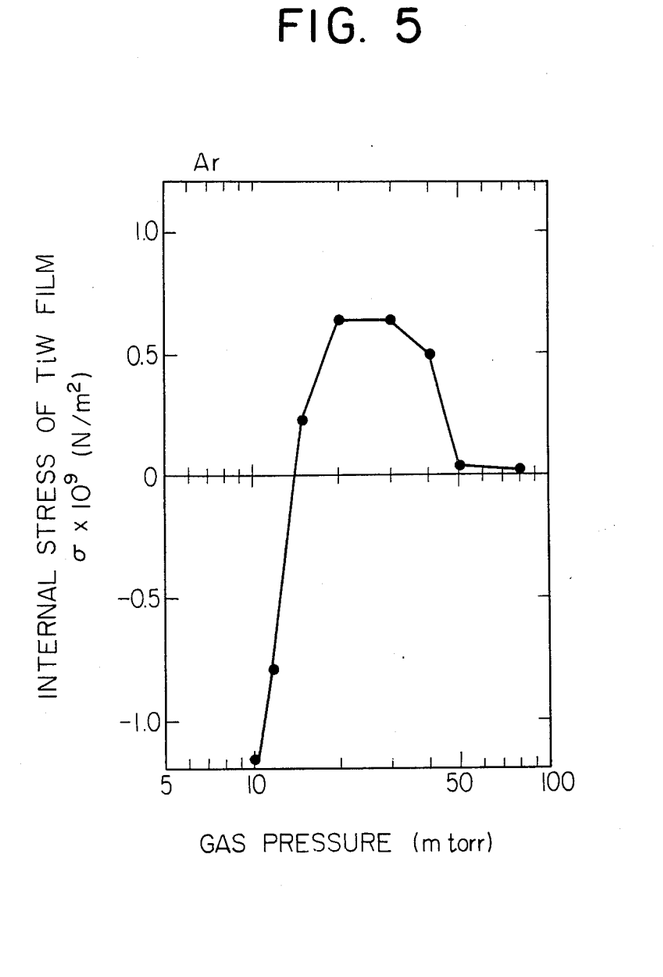
FIG. 5 is a graph showing the relationship between the internal stress in a Ti-W alloy film formed by sputtering in argon gas and the gas pressure during sputtering.

In order to reduce the distortion of the absorber pattern for an x-ray mask, the internal stress in the Ti-W alloy film from which the absorber pattern is formed should be as low as possible. When forming the above-described Ti-W alloy film on a mask substrate using sputtering, the internal stress of the film is highly dependent on the pressure of the gas in which sputtering takes place. The relationship between gas pressure during sputtering and the internal stress in the resulting film is illustrated in FIG. 5, which was obtained by performing DC discharge sputtering at different pressures in an argon gas atmosphere. As the pressure of the argon gas increases from a low pressure (10 mtorr), the internal stress of the resulting Ti-W alloy film abruptly changes from a compressive stress to a tensile stress. At an argon gas pressure of greater than 30 mtorr, the internal stress decreases as the gas pressure increases, and above a gas pressure of 50 mtorr, the internal stress becomes a low, substantially constant value. Thus, in order to obtain a Ti-W alloy film with a low internal stress, sputtering in an argon gas atmosphere should be performed under a pressure of either about 14 mtorr or of greater than about 50 mtorr.

A high density is another property which is required of an absorber pattern for an x-ray mask. The density of a Ti-W alloy film formed under the conditions used for FIG. 5 was 18.9 g/cm$^3$ at an argon gas pressure of 14 mtorr, which is a satisfactory value. In contrast, the density was only at most 13.0 g/cm$^3$ for an argon gas pressure of 50 mtorr or above, which was too low a density for the film to adequately function as an absorber. Therefore, in order to form a Ti-W alloy film with a low internal stress and adequate density by sputtering in an argon atmosphere, the gas pressure should be at a level at which the internal stress is zero, i.e., at 14 mtorr.

However, the slope of the curve in FIG. 5 is extremely steep where it crosses the horizontal axis, meaning that at a pressure of 14 mtorr, the internal stress of the resulting film is extremely sensitive to small changes in gas pressure. As a result, when using an argon gas atmosphere for sputtering, it is very difficult to obtain a low stress, high density Ti-W alloy film with good reproducibility.

The present inventors found that if a Ti-W alloy film is formed on a mask substrate by sputtering in an (argon+nitrogen) gas mixture, nitrogen is included in the Ti-W alloy film, and a low stress film can be formed with good reproducibility. Accordingly, in the method of the present invention, the Ti-W alloy film is preferably formed in such a manner.

Figure 6:
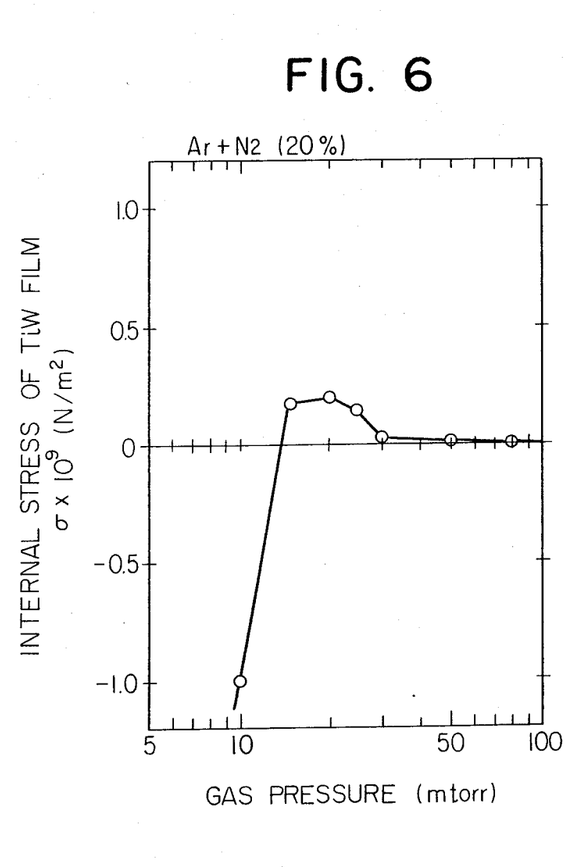
FIG. 6 is a graph showing the relationship between the internal stress in a Ti-W alloy film formed by sputtering in an atmosphere of (argon+20% nitrogen) and the gas pressure during sputtering.
Figure 7:
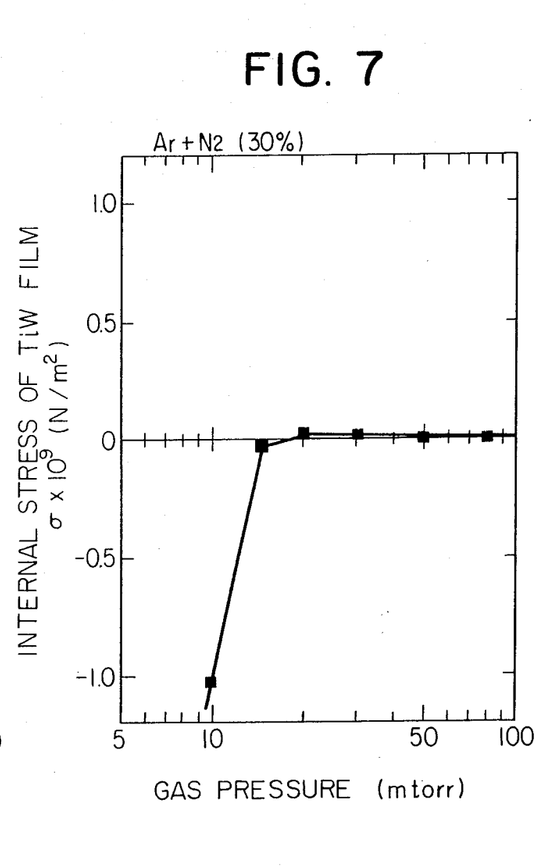
FIG. 7 is a graph showing the relationship between the internal stress in a Ti-W alloy film formed by sputtering in an atmosphere of (argon+30% nitrogen) and the gas pressure during sputtering.

FIG. 6 is a graph showing the relationship between the internal stress in a Ti-W alloy film formed by sputtering and the gas pressure of a reactive gas atmosphere comprising argon plus nitrogen in which the film was formed. The nitrogen content of the atmosphere was 20%, and sputtering was performed using a Ti-W alloy target by discharge at a power of 1 kw DC. FIG. 7 is a graph similar to FIG. 6, illustrating the relationship between internal stress and gas pressure during sputtering in an (argon+nitrogen) atmosphere with a nitrogen content of 30%. The sputtering conditions were otherwise the same as for the sputtering of FIG. 6.

As shown in FIG. 6, when sputtering was performed in an (argon+nitrogen) atmosphere with a nitrogen content of 20%, the relationship between internal stress in the resulting Ti-W alloy film and gas pressure was qualitatively similar to the relationship shown in FIG. 5 for sputtering carried out in an argon atmosphere. As the pressure rose from a low value of 10 mtorr, the internal stress in the Ti-W alloy film abruptly changed from compressive to tensile stress. At a gas pressure of greater than 30 mtorr, the internal stress reached a low, substantially constant value. However, the maximum tensile stress was only about ⅓ of the maximum value shown in FIG. 5 for a film formed by sputtering in argon gas. This clearly illustrates that the inclusion of nitrogen gas in a Ti-W alloy film helps to decrease internal stress.

In the case of FIG. 7, in which the nitrogen content of the (argon+nitrogen) atmosphere was 30%, as the gas pressure increased from 10 mtorr to 15 mtorr, the internal stress abruptly changed from a compressive stress to a very low tensile stress. As the gas pressure was further increased above 15 mtorr, the rate of change of internal stress with respect to gas pressure was extremely low. The internal stress in a Ti-W alloy film formed under a gas pressure of 20 mtorr to 30 mtorr was a very small value of 0.5–2.0×10$^8$N/m$^2$, which is fully satisfactory for an absorber pattern for an x-ray mask. Furthermore, the densities of the Ti-W alloy films formed in this pressure range were 17–18.5 g/cm$^2$, and the absorption coefficients thereof were completely adequate.

Next, in an (argon+nitrogen) atmosphere with a nitrogen content of 30%, Ti-W alloy film were formed 10 times by sputtering under a constant pressure of between 20 mtorr and 30 mtorr and the internal stress of each film was measured. The average variation among the internal stresses was less than 5%, demonstrating that the present method has good reproducibility.

Next, a Ti-W alloy film with a thickness of 1 micron was formed atop a thin BN substrate with a diameter of 50 mm and a thickness of 4 microns by sputtering in an (argon+nitrogen) atmosphere with a nitrogen content of 30% under a pressure of 30 mtorr. A pattern was then etched on the resulting Ti-W alloy film by reactive ion etching using CF$_4$ gas to obtain an x-ray absorber pattern. Using an optically-interfering type coordinate-measuring device, the positional accuracy of the pattern was measured. The positional deviation $\sigma xy$ with respect to the design value was found to be at most ±0.08 microns, showing that an x-ray mask with low distortion can be easily obtained by the method of the present invention.

The present inventors performed similar experiments using various mixtures of argon and nitrogen gas and found that particularly good results can be obtained when the nitrogen content of the gas mixture is 30–50%.

Instead of a mixture of argon and nitrogen, it is also possible to employ a mixture of argon and any gaseous nitrogen compound which makes it possible for nitrogen to be included in the resulting Ti-W alloy film.

Although in the above-described example of forming a Ti-W alloy film a Ti-W alloy was used as a target for sputtering, as long as nitrogen can be included in the resulting Ti-W alloy film, it is also possible to employ a target made of a metal alloy having nitrogen included therein prior to sputtering.

What is claimed is:

1. An x-ray mask comprising:
    a mask substrate that is permeable to x-rays; and
    an x-ray absorber disposed on said substrate and formed into a pattern, said absorber being made from a Ti-W alloy with a Ti content of approximately 0.5–10 weight % in a sufficient thickness to absorb x-rays.

2. An x-ray mask comprising:
    a mask substrate that is permeable to x-rays; and
    an x-ray absorber disposed on said substrate, formed into a pattern, made from a Ti-W alloy containing nitrogen and having a Ti content of approximately 0.5–10 weight %, and of sufficient thickness to absorb x-rays.

3. A manufacturing method for an x-ray mask comprising:
    forming a first film which serves as an etching stopper on a mask substrate which is permeable to x-rays, forming a Ti-W alloy film having a Ti content of approximately 0.5–10 weight % on said first film in a thickness sufficient to absorb x-rays, forming a third film on said alloy film, and depositing an electron beam-sensitive resist on said third film;

exposing said resist in a prescribed pattern to an electron beam and then developing said exposed resist to form a resist pattern;

selectively etching said third film while using said resist pattern as a mask to form a pattern in said third film; and selectively etching said Ti-W alloy film with a reactive gas by reactive ion etching while using said pattern of the third film as a mask and the first film as an etchant stop for the reactive gas to form said Ti-W alloy film into a prescribed pattern.

4. A method as claimed in claim 3, wherein said first and third films are made of a material which is more difficult to etch with said reactive gas than said Ti-W alloy film.

5. A method as claimed in claim 4, wherein said first and third lower films are made of $SiO_2$.

6. A method as claimed in claim 3, wherein said reactive gas for etching said Ti-W alloy film is a mixture of $CF_4$ and $O_2$.

7. A method as claimed in claim 3, wherein said Ti-W alloy film is formed on said first film by sputtering in an atmosphere comprising argon and nitrogen gas, whereby nitrogen is included in said Ti-W alloy film.

8. A method as claimed in claim 7, wherein the nitrogen content of said atmosphere is approximately 30–50%.

9. A manufacturing method for an x-ray mask comprising:

forming a first film which serves as an etching stopper on a mask substrate which is permeable to x-rays, forming a Ti-W alloy film containing nitrogen and having a Ti content of approximately 0.5–10 weight % on said first film in a thickness sufficient to absorb x-rays, forming a third film, depositing an electron beam-sensitive resist on said third film;

exposing said resist in a prescribed pattern to an electron beam and then developing said exposed resist to form a resist pattern;

selectively etching said third film while using said resist pattern as a mask to form a pattern in said third film; and selectively etching said Ti-W aloy film with a reactive gas by reactive ion etching while using said pattern of the third film as a mask and the first film as an etchant stop for the reactive gas to form said Ti-W alloy film into a prescribed pattern.

* * * * *